(12) United States Patent  
Partridge et al.

(10) Patent No.: US 7,573,129 B2
(45) Date of Patent: Aug. 11, 2009

(54) CONTRAST INTERPOSER STACKING SYSTEM AND METHOD

(75) Inventors: Julian Partridge, Austin, TX (US); Roel Perez, Mission, TX (US); Leland Szewerenko, Austin, TX (US)

(73) Assignee: Entorian Technologies, LP, Austin, TX (US)

( * ) Notice: Subject to any disclaimer, the term of this patent is extended or adjusted under 35 U.S.C. 154(b) by 133 days.

(21) Appl. No.: 11/533,743

(22) Filed: Sep. 20, 2006

(65) Prior Publication Data

US 2007/0290314 A1 Dec. 20, 2007

Related U.S. Application Data

(63) Continuation-in-part of application No. 11/452,532, filed on Jun. 14, 2006, now Pat. No. 7,375,418.

(51) Int. Cl.
*H01L 23/02* (2006.01)

(52) U.S. Cl. .............................. 257/686; 257/E23.049
(58) Field of Classification Search ................. 257/686, 257/668
See application file for complete search history.

(56) References Cited

U.S. PATENT DOCUMENTS

| 5,656,856 | A | * | 8/1997 | Kweon ........................ 257/686 |
| 6,194,085 | B1 | * | 2/2001 | Fasano et al. ............... 428/620 |
| 6,542,393 | B1 | * | 4/2003 | Chu et al. ..................... 365/51 |
| 6,572,387 | B2 | * | 6/2003 | Burns et al. .................... 439/69 |
| 6,608,763 | B1 | * | 8/2003 | Burns et al. ................. 361/790 |
| 2003/0168725 | A1 | * | 9/2003 | Warner et al. ............... 257/686 |
| 2005/0133897 | A1 | * | 6/2005 | Baek et al. .................. 257/686 |
| 2007/0290313 | A1 | * | 12/2007 | Partridge .................... 257/686 |

* cited by examiner

*Primary Examiner*—Sue Purvis
*Assistant Examiner*—Benjamin P Sandvik
(74) *Attorney, Agent, or Firm*—Fish & Richardson P.C.

(57) ABSTRACT

The present description provides increased contrast between interposer and leads in a stack embodiment that employs an interposer that extends beyond a boundary or perimeter established by the leads of the constituent IC devices.

20 Claims, 9 Drawing Sheets

CONTRAST INTERPOSER STACKING SYSTEM AND METHOD

RELATED APPLICATIONS

The present application is a continuation-in-part of U.S. patent application Ser. No. 11/452,532, filed Jun. 14, 2006, now U.S. Pat. No. 7,375,418, which is hereby incorporated by reference.

TECHNICAL FIELD

The present invention relates to stacked integrated circuits and, in particular, to techniques and systems directed to alignment of stacks with locations on circuit boards.

BACKGROUND

A variety of techniques are used to stack integrated circuits. Some require that the circuits be encapsulated in special packages, while others use circuits in conventional packages. Both leaded and BGA type packaged integrated circuits (ICs) have been stacked. Although BGA packaging is becoming widely adopted leaded packages are still employed in large volumes in low cost applications such as, for examples flash memory. Flash memory is typically packaged in thin small outline packages otherwise known as TSOPs, a type of leaded packaged integrated circuit.

When leaded packages such as TSOPs are stacked, a variety of techniques have been employed. In some cases, the leads alone of packaged circuits have been used to create the stack and interconnect its constituent elements. In other techniques, structural elements such as printed circuit boards (PCBs) are used to create the stack and interconnect the constituent elements.

Circuit boards and rail-like structures in vertical orientations have been used for years to provide interconnection between stack elements. For example, in U.S. Pat. No. 5,514,907 to Moshayedi, a technique is described for creating a multi-chip module from surface-mount packaged memory chips. The devices are interconnected on their lead emergent edges through printed circuit boards oriented vertically to a carrier or motherboard that is contacted by connective sites along the bottom of the edge-placed PCBs, The PCBs have internal connective rail-like structures or vias that interconnect selected leads of the upper and lower packaged memory chips. Japanese Patent Laid-open Publication No. Hei 6-77644 discloses vertical PCBs used as side boards to interconnect packaged circuit members of the stack. In U.S. Pat. No. 5,266,834 to Nishi et al., one depicted embodiment illustrates a stack created by selective orientation of the leads of particularly configured stack elements, while in U.S. Pat. No. 5,343,075 to Nishino, a stack of semiconductor devices is created with contact plates having connective lines on inner surfaces to connect the elements of the stack. Another technique for stacking leaded packaged ICs with carrier structures or interposers oriented along lead bearing sides of packaged devices such as TSOPs is disclosed by the present assignee, Staktek Group L.P., in U.S. Pat. No. 6,608,763 to Bumns et al.

Many of the previously cited and known techniques for using PCBs and similar interposer structures for stacking leaded packaged devices have evolved to meet the increased connective complexity presented by, for example, stacking memory components that have two chip enables per packaged device. In some cases, this evolution has included use of interposer designs that employ four layer designs to implement the more complex connection strategies required by more complex devices. This has led to complexities in via and connection strategies, however.

Higher layer count PCBs and similar interposers are more expensive and difficult to produce than simpler designs with fewer layers. Such connective elements also typically exhibit wider variations across the population.

Staktek Group L.P., the assignee of the present application has developed a system and method for selectively stacking and interconnecting leaded packaged integrated circuit devices with connections between the feet of leads of an upper IC element and the upper shoulder of leads of a lower IC element while traces that implement stacking-related intra-stack connections between the constituent ICs are implemented in interposers or carrier structures oriented along the leaded sides of the stack and which extend beyond the perimeter of the feet of the leads of the constituent ICs or beyond the connective pads of the interposer. This leaves open to air flow, most of the transit section of the lower lead for cooling, but provides a less complex board stricture for implementation of intra-stack connections.

SUMMARY OF THE INVENTION

Interposers employed to interconnect the constituent ICs of integrated circuit stacks exhibit areas visually distinct from the leads of the constituent stack ICs. When interposers extend beyond the leads, it becomes more difficult for vision systems to acquire the leads for purposes of placing the stack in its designated location on, for example, a circuit board. What is needed therefore, is a system and method for adapting stacks that employ interposers for enhanced vision system board population.

DETAILED DESCRIPTION

The present description provides increased contrast between interposer and leads in a stack embodiment that employs an interposer that extends beyond a boundary or perimeter established by the leads of the constituent IC devices. The principles of the invention may, however, be applied to a variety of interposer and IC combinations and configurations with consequent advantages for board population with stacks as those of skill will recognize after appreciating this specification.

Figure 1A:
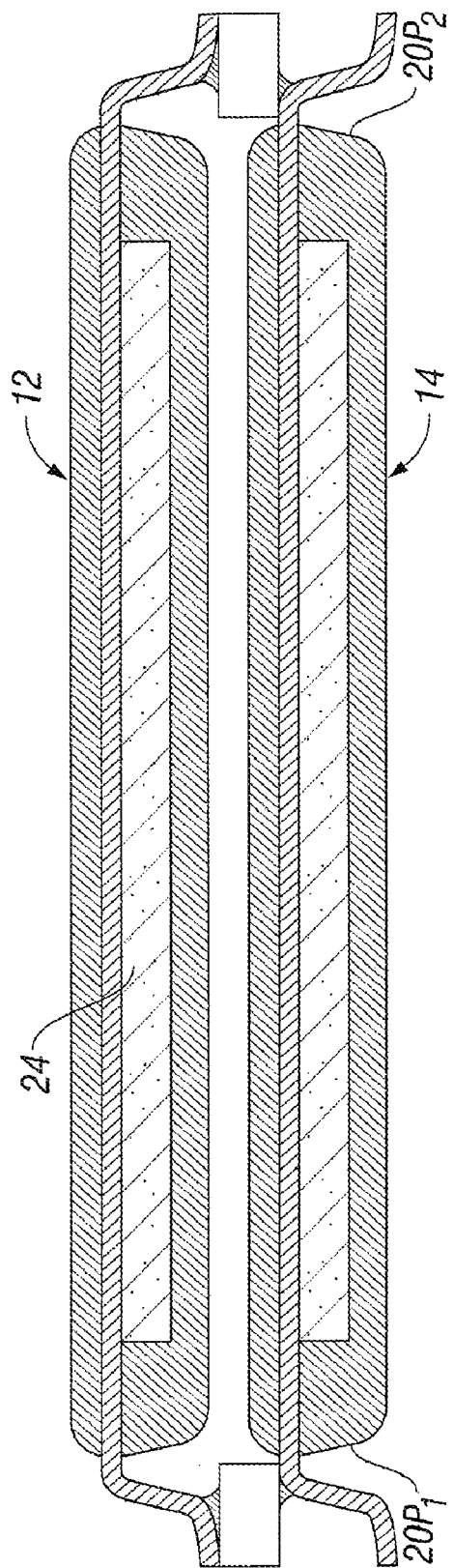
FIGS. 1A and 1B depict a cross-section of a prior art circuit module that employs interposers (e.g., "carrier structures", "side boards") that implement intra-stack connections.
Figure 1B:
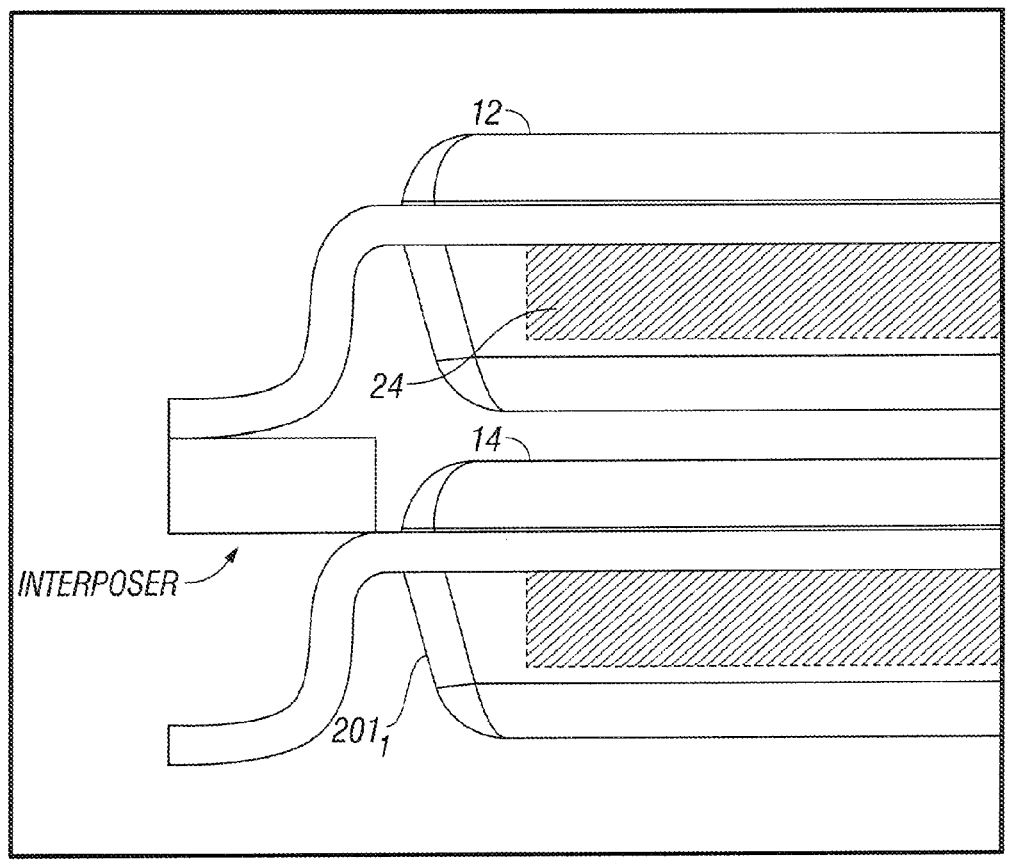

FIG. 1A depicts a cross-section of a portion of a prior art circuit module that employs interposers (e.g., "carrier structures", "side boards") that implement intra-stack connections. As shown, interposers reside along the edge of the module and interconnects the feet of leads that emerge from first and second peripheral sides 20P1 and 20P2 of the upper IC 12 to the shoulder of leads of the lower IC 14. The ICs have within their respective packages integrated circuit die 24. FIG. 1B is an enlarged portion of the view of FIG. 1A. The depicted ICs are typically thin small outline packages known as TSOPs which are a common packaging option for flash memory circuitry. In structures such as that depicted in FIGS. 1A and 1B, the interposers typically extend to about the feet of the constituent ICs and any needed traces that connect non-adjacent pads of the interposers transit through buried layers of the interposer.

Figure 2A:
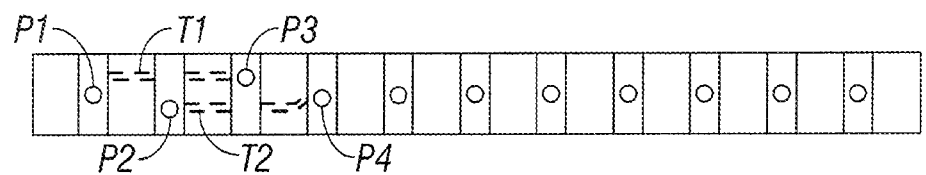
FIGS. 2A and 2B various views of an interposer employed in the prior art circuit module depicted in FIGS. 1A and 1B.
Figure 2B:
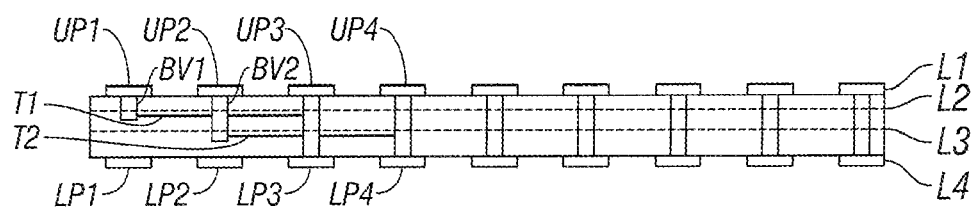

FIGS. 2A and 2B various views of an interposer employed in the prior art circuit module depicted in FIGS. 1A and 1B. FIG. 2A is a plan view of a prior art interposer from above and depicts with dotted lines two traces T1 and T2 routed through buried layers in the interposer in ways that avoid interference with vias P2 and P3, respectively. FIG. 2B depicts a cross-sectional view from the side of an interposer employed in the prior art module shown in FIGS. 1A and 1B. Consequently, the substantial coincidence between the leads of the constituent ICs and the employed interposers does not impede upwardly-directed vision system alignment. An accurate evaluation of important dimensional aspects of the module such as, for example, the location of the leads may be made and thus efficient population of motherboards or other applications may proceed with such stacks as with monolithic devices.

There are, however, reasons to construct stacks with interposers that do not coincide with the leads of the constituent ICs. As those of skill understand, typically only one of the constituent IC devices of a stack is enabled at a time. However, some TSOPs have two chip enable leads that must be signaled for device enablement. This adds complexity to the interposer design and fabrication. Designers of stacks that employ interposers disposed between the feet of the upper IC and the shoulders of the lower IC typically try to keep the profile of the stack approximately the same as the profile of the constituent IC devices. This objective and the need for differential enablement strategies in connecting the upper and lower ICs typically causes designers to resort to buried layers in the interposer to implement trace connections between leads, particularly when the leads to be connected are not adjacent on the IC. This can require moving particular pins to avoid interference between a pin that is between two pins that are to be connected by a trace. FIGS. 2A and 2B illustrate a particular example of the complexity problem presented by stacking TSOP devices with feet-to-shoulder interposers, each disposed along a leaded side of the constituent devices where profiles for the resulting stack are commensurate with the profiles of the constituent ICs.

Consequently, as shown in FIGS. 2A and 2B, blind vias such as those identified as BV1 and BV2 are connected to traces T1 and T2 and then to lower pads LP3 and LP4. Thus, signals at LP3 are conveyed to upper pads UP3 and UP1 while signals at LP4 are conveyed to UP4 and UP2. Traces T1 and T2 are, however, implemented at layers 2 and 3 respectively, of the depicted four layer board (showing layers L1, L2, L3, and L4). Layers 2 and 3 are, however, buried in the interposer. As those of skill will recognize, PCB materials that may be used as interposers in such applications can be devised with multiple buried metal layers to implement trace connections between vias but such structures are likely to exhibit thicker profiles and are complex to manufacture efficiently and may have wider variations from instance to instance.

As discussed, for many reasons, designers of this category of stack have typically tried to stay within profile limits thus resulting in implementation of carrier structures or interposers that exhibit the more complex designs alluded to and an example of which was just described. However, profile requirements are typically intended, amongst other things such as vision system adaptation, to preserve mounting board area. Thus, if a profile constraint is intended to preserve mounting board area but is not devised to limit cantilever designs that may exceed the profile but only above the surface of the mounting board, a wider interposer above mounting circuit board level may, in some cases, be employed to preserve board mounting space and still implement connections in stacks which retain the foot to shoulder interposer constructions that keep a substantial portion of the leads open. This may still leave open a potential problem with vision system placement of such modules on circuit board applications.

Figure 3:
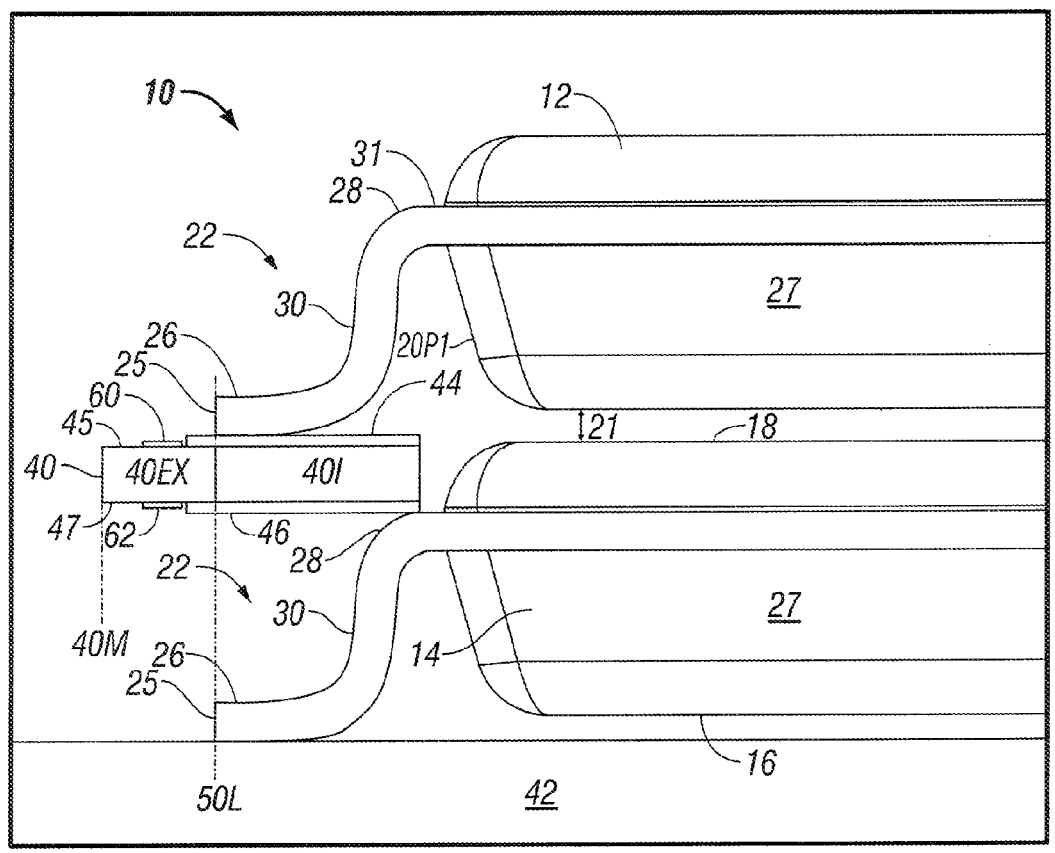
FIG. 3 depicts a cross-section of a portion of circuit module that employs interposers that exhibit external traces on the respective upper and lower surfaces for implementing connections between two non-adjacent leads in a preferred embodiment of the present invention.

FIG. 3 depicts a cross-section of a portion of circuit module 10 that employs interposer 40 that exhibits external traces 60 and 62 on the respective upper and lower surfaces 45 and 47 of interposer 40 for implementing, for example, connections between two non-adjacent leads. As shown, module 10 is created with upper IC 12 and lower IC 14. Each of ICs 12 and 14 are, in the depicted preferred embodiment, plastic encapsulated memory circuits disposed in thin small outline packages known as TSOPs. Other package types may be used with the present invention as well as packaged circuits other than memories, but, as described here as preferred examples, the invention is advantageously implemented with memories in TSOP packaging. Flash memory circuits implemented in TSOP packaging are one type of preferred constituent ICs 12 and 14. As shown in FIG. 3 as to lower IC 14, but present in both IC 12 and 14 of module 10, each IC has a lower surface 16, upper surface 18 and periphery. In this FIG. 3, there is depicted an air gap 21 between IC 12 and IC 14 although a heat transference material or adhesive (thermally conductive being preferred) may reside between the ICs as indicated in later FIG. 5 with reference 34.

As depicted in FIG. 3, emergent from package peripheral wall or edge 20P1, plural leads, one of which is illustrated as lead 22, provide a connective pathway for the electronics of the circuitry chip embedded within plastic body 27 of exemplar IC 12. Those of skill will note that in a typical embodiment, the leads are emergent from each of two peripheral sides 20P1 and 20P2 of the respective IC. There are, however, some packages that may have leads emergent from greater or fewer numbers of peripheral sides.

Lead 22 of tipper IC 12 is shown as having foot 26 and shoulder 28 and transit section 30 but similar features may be identified in lead 22 of lower IC 14. Shoulder 28 can extend from and include the planar part of lead 22 emergent from peripheral wall 20P (i.e., the "head" of the shoulder identified by reference 31) to the end of the curvature into transit section 30. As leads 22 emerge from the package periphery, a supportive shelf or plane is created or defined (respectively) by the heads of the plurality of leads on a side. These features of lead 22 are present in conventional TSOP packaged memory circuits such as flash memory available from most major suppliers of packaged memories. Foot 26 is provided to allow the mounting of the TSOP IC on the surface of a printed circuit or other carrier and signal transit board and has terminus 25. The termini 25 of the feet of the plural leads 22 define a line 50L that coincides with the profile for the ICs as well as stacked module 10 at the level of the circuit board. In FIG. 3. circuit module 10 is shown mounted on circuit board 42.

Shoulder 28 arises from providing foot 26 for surface mount connection of the IC, while transit section 30 of lead 22 connects shoulder 28 with foot 26. In practice, lead 22 and, in particular, transit section 30 are surfaces from which heat from the internal chip(s) of the TSOP is dissipated by local air convection. Transit section 30 is often a substantially straight path but may exhibit curvature or angles.

Interposer or carrier structure 40 is shown in FIG. 3 as being interposed between shoulder 28 of lead 22 of lower IC 14 and foot 26 of lead 22 of upper IC 12. In a preferred embodiment, interposer 40 has upper and lower substantially planar surfaces 45 and 47, respectively. Upper surface 45 bears a row of plural upper connective elements 44 and lower surface 47 bears a row of plural lower connective elements 46. These elements 44 and 46 are shown as resting upon upper and lower surfaces 45 and 47 of interposer 40, respectively, but as those of skill will recognize, these elements or pads may be embedded into those surfaces and in typical applications will be implemented as pads.

In module 10, upper connective elements 44 are disposed beneath the feet of the leads of IC 12 and the lower surface 47 is placed along the plane of heads 31 of selected leads of lower IC 14 as shown in FIG. 3. Carrier structure or interposer 40 is, in a preferred embodiment, printed circuit board material or other carrier material disposed between corresponding leads of constituent elements of module 10. Other structures that provide connective elements in an insulative bed or carrier may be employed as interposer or carrier structure 40.

In a preferred embodiment, two interposers 40 are typically employed in a module 10 comprised from two TSOP memory devices. One interposer 40 is disposed along one leaded periphery of module 10, while another interposer 40 is disposed in conjunction with an opposite leaded periphery of the module. The same principles may be applied to stacks where the constituent ICs have more or fewer than two leaded sides.

Imaginary line 50L may be defined by the terminal ends 25 of the feet 26 of leads 22 of upper IC 12. As those of skill know, a TSOP IC has a plurality of leads, and the plural ends of the feet of those plural leads are aligned in a row. That row line of the ends or termini 25 constitute line 50L.

Figure 5:
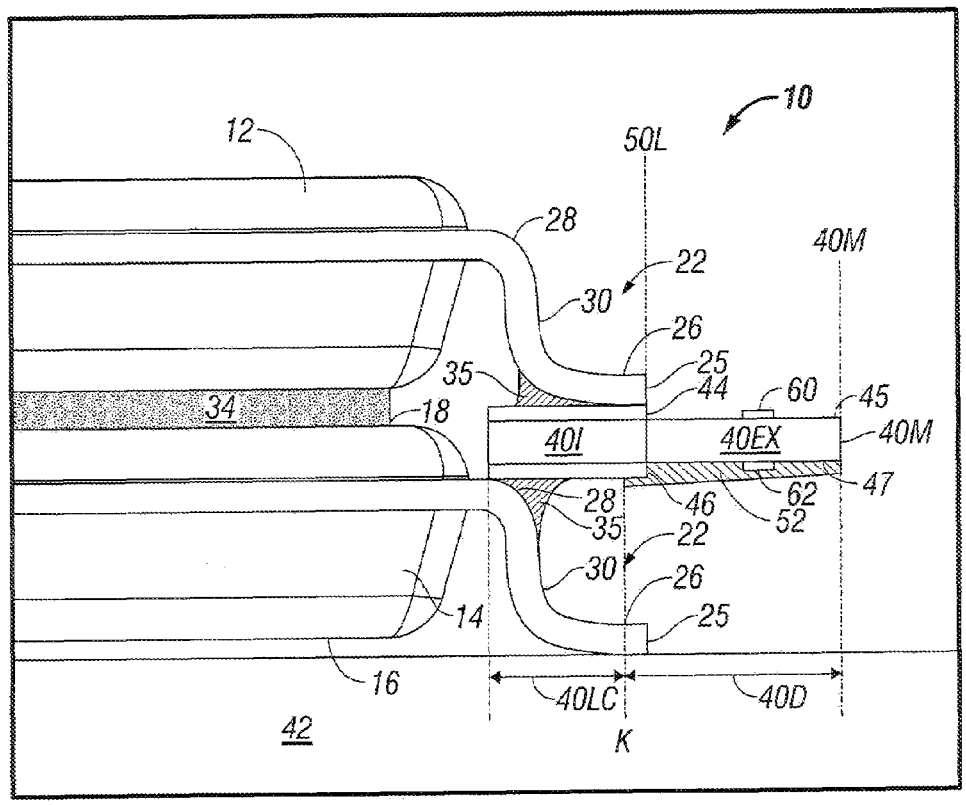
FIG. 5 illustrates a cross-sectional view of a portion of a circuit module 10 according to a preferred embodiment of the present invention.

As those of skill will recognize, when there is not coincidence between the widest lateral extent of an interposer and the termini of leads of the constituent ICs connected with the interposer, vision system equipment may not be able to adequately or accurately acquire the coordinates of lead termini 25 for purposes of board population. For example, as shown in FIG. 5, interposer 40 extends beyond the termini 25 of feet 26 to imaginary line 40M as shown. The assignee of the present invention has recognized that when no provision is made to enhance the contrast between the leads 22 and interposer 40, vision system acquisition of leads 22 for board population purposes becomes problematic when the widest lateral extent for interposer 40 (identified by line 40M) exceeds line 50L that identifies the termini 25 of feet 22.

Figure 4:
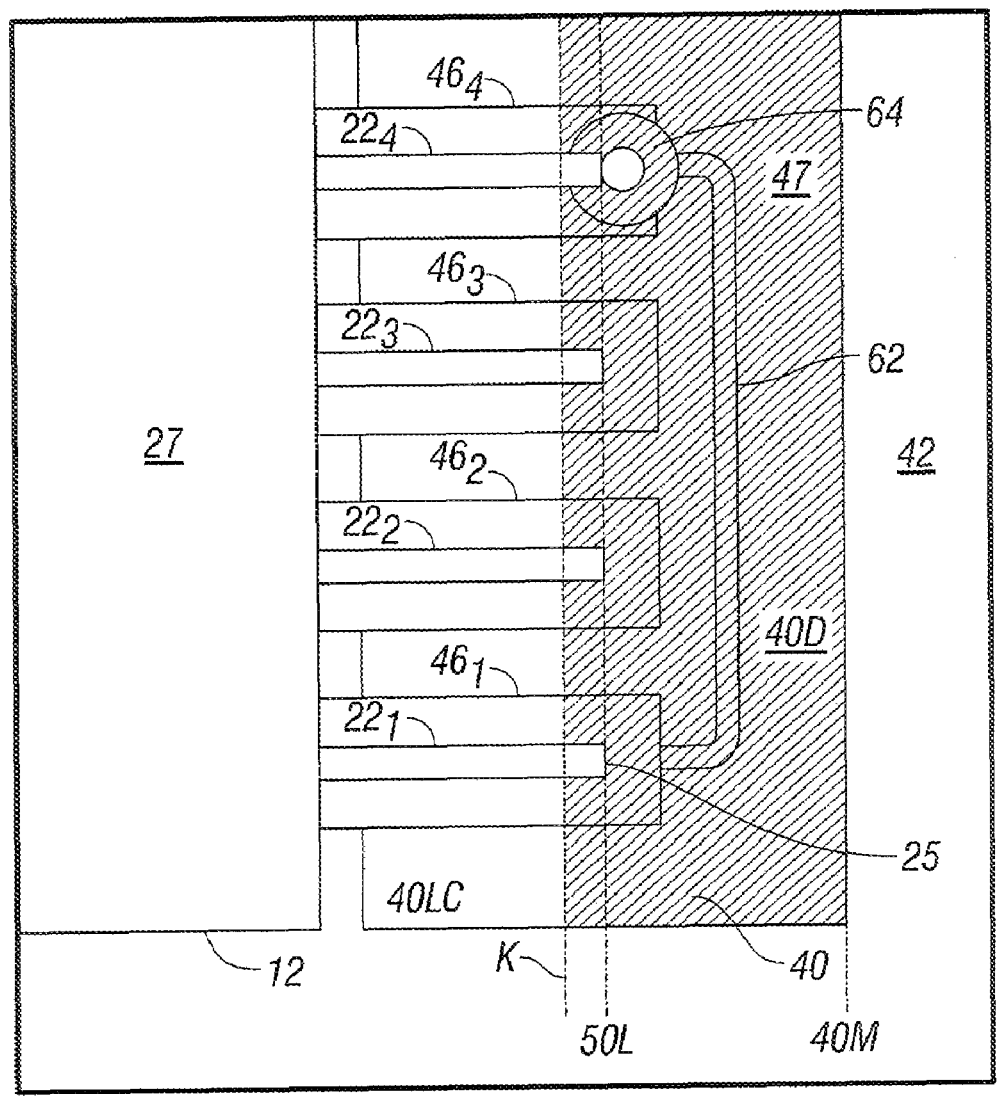
FIG. 4 depicts a plan view from below a portion of an interposer showing leads disposed on lower connective pads in accordance with a preferred embodiment of the present invention.

FIG. 4 depicts a plan view from below of a portion of an interposer 40 and leads $22_1$-$22_4$ (e.g., feet 26) as disposed on lower connective elements $46_1$-$46_4$. Connective trace 62 is shown extending from lower connective elements $46_1$ to lower connective element $46_4$. Illustrative via 64 is shown associated with lower connective element $46_4$.

A portion of interposer 40 is shaded to represent dark portion 40D. Another portion of interposer 40 represents light portion or area 40LC of interposer 40 and separation between areas 40D and 40LC is indicated with imaginary line K. Further, dark areas 40D need not be contiguous for a particular interposer and may be localized in relation to particular feet of the lower one of the constituent ICs of the module and therefore, may be implemented by plural selected dark areas 40D on a single interposer lower side. Imaginary line K should be closer to body 27 of the constituent ICs than the termini 25 of leads 22 (i.e., line 50L). As shown in later FIG. 5, interposer 40 is also allocated into two sections, an inner section 40I toward the body 27 of IC 12 and an outer or external section 40EX. The line between interposer sections 40I and 40EX is line SOL which is coincident with the termini of leads 22. Dark area or portion 40D may be realized with ink or a darker solder mask, just as examples, as shown in FIG. 5. A darker dye may also be employed in the fabrication of interposer 40. The resulting higher contrast between leads 22 and dark area 40D improves vision system performance by allowing vision equipment to more easily acquire the coordinates of features of leads 22, for example, such as termini 25.

FIG. 5 illustrates a cross-sectional view of a portion of a circuit module 10 according to a preferred embodiment of the present invention. Interposer or carrier structure 40 is soldered into place as shown by solder 35 that improves the connection of foot 26 of upper IC 12 with upper connective element 44 of carrier structure 40. Upper and lower ICs 12 and 14 are physically connected together with adhesive 34 in this depicted embodiment.

In the embodiment shown in FIG. 5, connective elements 44 and 46 are typically etched pads although other means of connection are known in the art. Solder 35 is also shown providing certain connection between lead 22 of lower IC 14 and lower connective element pad 46 of interposer or carrier structure 40. As shown, termini 25 of leads 22 establish line 50L.

Imaginary line K identifies separation between dark portion 40D and lighter portion 40LC. As shown, line K is closer to ICs of module 10 than is imaginary line 50L and, in particular, is closer to body 27 of the lower IC of the module than is line 50L. Those of skill will recognize that imaginary line K need not be a straight line.

Portion 40LC is more reflective of light than dark portion 40D. Along the lower part of interposer 40 and covering, in this embodiment, parts of exposed lower surface 47, trace 62, and part of lower connective elements 46 (as shown in earlier FIG. 4) contrast layer 52 realizes dark portion 40D of interposer 40 in the depicted embodiment.

Other modes of realizing dark portion 40D can include use of different dye or colors in PCB employed to fabricate interposer 40. When color or dye is embedded in PCB material to realize dark portion 40D of interposer 40, contrast layer 52 will either not be visible in a cross-sectional view due to its integration into the material of interposer 40 or it will be so small as to be indiscernible in cross-sectional view. When ink or solder mask material is employed to create dark portion 40D of interposer 40, it will typically not have the relative dimensions of contrast layer 52 as shown in FIG. 5 where such contrast layer 52 is dimensionally enhanced for heuristic purposes in the cross-sectional view.

Figure 6:
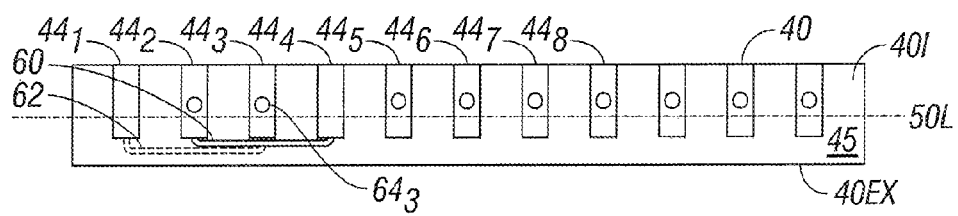
FIG. 6 is a plan view of an exemplar interposer or carrier structure illustrating the paths of connective traces along, the upper and lower surfaces of the interposer.

FIG. 6 is a plan view from above of an exemplar interposer or carrier structure 40 depicting the paths of connective traces 60 along upper surface 45 of interposer 40 and connective trace 62 (shown in dotted line) along lower surface 47 of interposer 40. As those of skill will recognize, traces 60 and 62 are composed from conductive (typically metal) layers on the upper and lower surfaces respectively of interposer 40.

Figure 7:
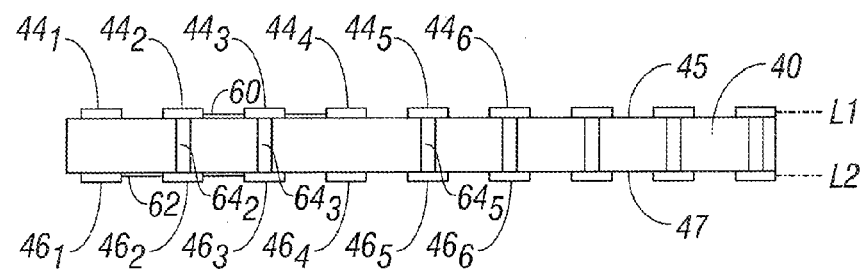
FIG. 7 illustrates in cross-section, an exemplar interposer or carrier structure in accordance with a preferred embodiment of the present invention.
Figure 8:
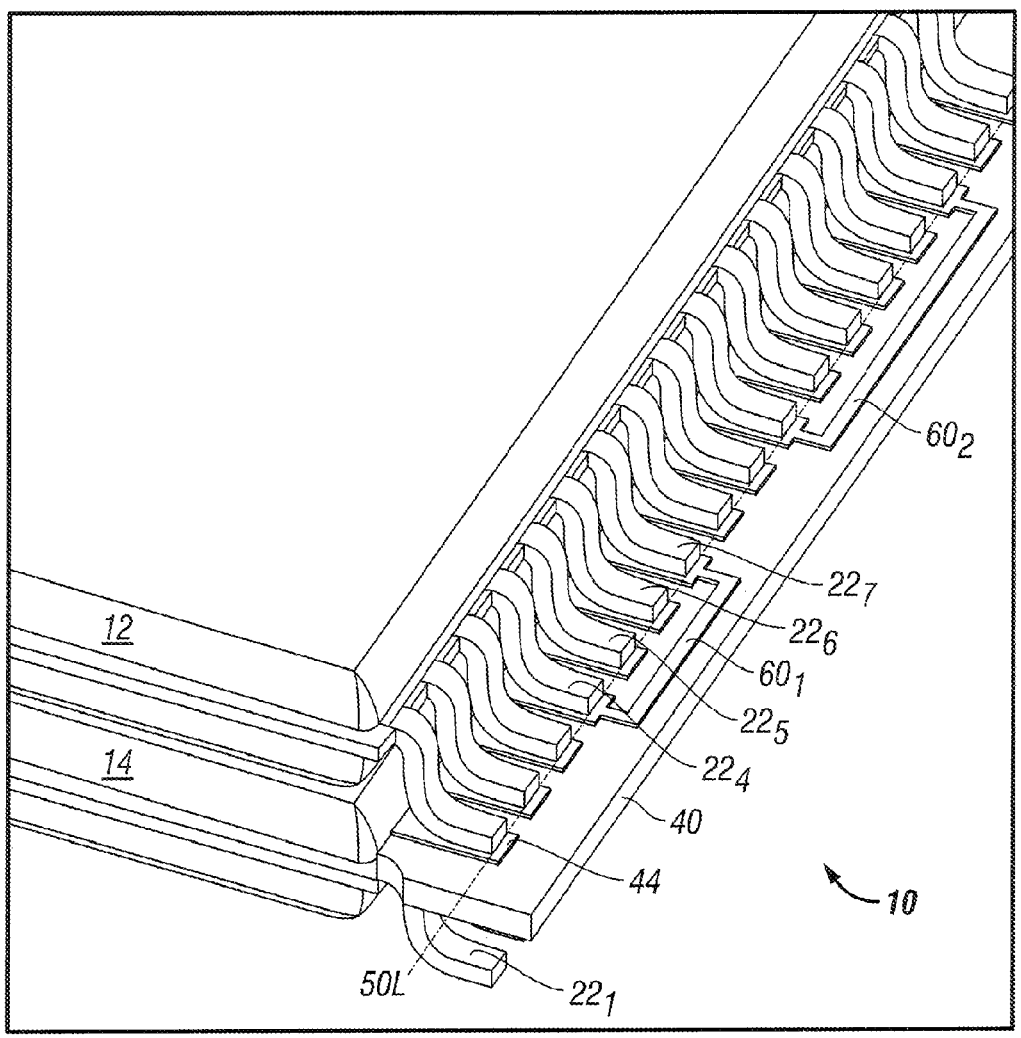
FIG. 8 depicts a portion of a circuit module in accordance with a preferred embodiment of the present invention.
Figure 9:
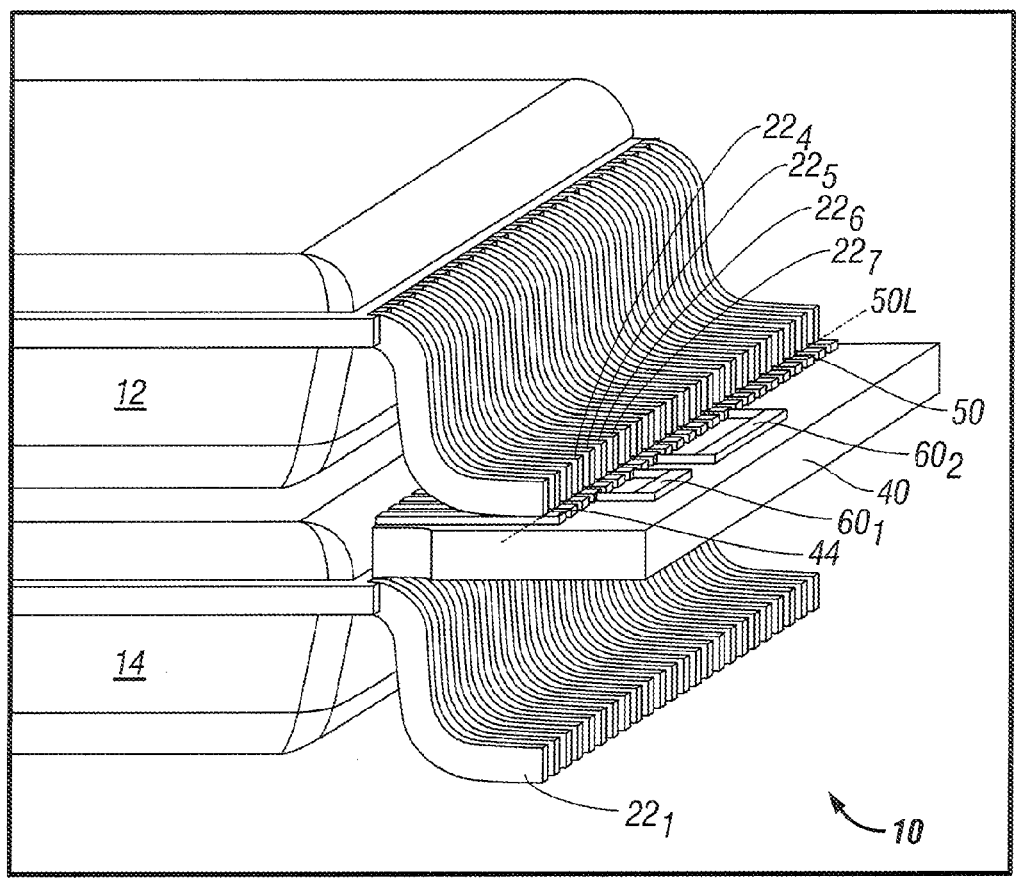
FIG. 9 is another view of a portion of a circuit module in accordance with a preferred embodiment of the present invention.

FIG. 7 further illustrates in cross-section, an exemplar interposer or carrier structure 40. Thus, with an interposer that can implement connections between non-adjacent leads or connective elements with one or more traces that extend into section 40EX, a simple construction may be adopted for interposer 40 with surface metal layers that express traces such as exemplar traces 60 and 62.

Upper and lower connective elements 44 and 46 are connected to each other in the embodiment shown in FIG. 7 through plated through holes or vias 64 typically drilled in the PCB (where PCB is the support material for interposer 40) during fabrication. The use of vias to connect conductive planes or traces in PCB technology is well known to those of skill in the art. In a preferred embodiment, vias 64 may also be cut through length-wise to create a castellation-like structure. Other connectives besides vias (e.g., traces) may be used to conduct signals between upper and lower connective elements 44 and 46.

Conductive layers L1 and L2 as shown in FIG. 7 on the upper and lower surfaces of interposer 40 are preferably etched to create the appropriate pattern for the upper and lower connective elements 44 and 46, respectively, as well as traces 60 and 62.

Although the present invention has been described in detail, it will be apparent that those skilled in the art that the invention may be embodied in a variety of specific forms and that various changes, substitutions and alterations can be made without departing from the spirit and scope of the invention. The described embodiments are only illustrative and not restrictive and the scope of the invention is, therefore, indicated by the following claims.

The invention claimed is:

1. A circuit module comprised of:
    first and second leaded packaged integrated circuits in stacked disposition with the first leaded package being disposed above the second leaded package, each of which first and second leaded packaged integrated circuits having a body emergent from which are leads that each have a shoulder and foot, the shoulders each having a head;
    a first interposer for electrical connection between the first and second leaded packaged integrated circuits, the first interposer having a dark portion and a light portion defined on a lower planar surface of the interposer and delineable with an imaginary line K, with the light portion being more reflective of light than is the dark portion and the first interposer having an external section and an internal section disposed on different sides of a line L defined by termini of a plurality of the feet of the leads of the first leaded packaged integrated circuit, the external section of the first interposer being further from the first packaged integrated circuit than is the internal section, and imaginary line K being closer to the body of the second packaged integrated circuit than is line L, wherein the dark portion extends through the line L.

2. The circuit module of claim 1 in which the dark portion of the first interposer is realized with a contrast layer.

3. The circuit module of claim 1 in which the dark portion of the first interposer is realized with colored PCB material.

4. The circuit module of claim 1 in which the dark portion of the first interposer is realized with dyed PCB material.

5. The circuit module of claim 1 in which the first and second leaded packaged integrated circuits are flash memory devices.

6. The circuit module of claim 1 further comprising:
    a second interposer for electrical connection between the first and second leaded packaged integrated circuits, the second interposer having a dark portion and a light portion delineable with an imaginary line K with the light portion being more reflective of light than is the dark portion and the second interposer having an external section and an internal section disposed on different sides of a line L defined by termini of a plurality of the feet of the leads of the first leaded packaged integrated circuit, the external section of the second interposer being further from the first packaged integrated circuit than is the internal section, and imaginary line K being closer to the body of the second packaged integrated circuit than is line L.

7. The circuit module of claim 1 in which a first trace extends onto the external section of the first interposer.

8. The circuit module of claim 1 in which the first trace connects two non-adjacent ones of upper or lower connective elements of the first interposer.

9. The circuit module of claim 6 in which thermally conductive adhesive is disposed between the first and second leaded packaged integrated circuits.

10. The circuit module of claim 1 in which a secondary first trace extends onto the external section of the first interposer.

11. The circuit module of claim 1 in which vias are disposed perpendicularly to first and second substantially planar surfaces of the first interposer.

12. The circuit module of claim 1 in which there are no buried layers in the first interposer.

13. The circuit module of claim 6 in which the first and second interposers are comprised of printed circuit board.

14. The circuit module of claim 6 in which the first and second interposers distance the first leaded packaged integrated circuit from the second leaded packaged integrated circuit and between the first and second interposers there resides a thermally conductive material.

15. The circuit module of claim 6 in which the first and second leaded packaged integrated circuits are memory circuits.

16. The circuit module of claim 6 in which the first and second packaged integrated circuits are flash memory circuits.

17. The circuit module of claim 1 in which the first and second leaded packaged integrated circuits are TSOP packaged memory circuits.

18. The circuit module of claim 1 in which thermally conductive material resides in a space between the first and second leaded packaged integrated circuits.

19. The circuit module of claim 1 in which the space between the first and second leaded integrated circuits is an air gap.

20. The circuit module of claim 6 in which the first and second interposers are etched printed circuit board patterned to connect a no-connect one of the leads of the second leaded packaged integrated circuit with an active lead of the first leaded packaged integrated circuit.

* * * * *